(12) United States Patent
Kawata

(10) Patent No.: US 10,608,073 B2
(45) Date of Patent: Mar. 31, 2020

(54) DISPLAY DEVICE

(71) Applicant: Japan Display Inc., Minato-ku (JP)

(72) Inventor: Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/504,943

(22) Filed: Jul. 8, 2019

(65) Prior Publication Data

US 2019/0333981 A1 Oct. 31, 2019

Related U.S. Application Data

(63) Continuation of application No. 15/478,400, filed on Apr. 4, 2017, now Pat. No. 10,396,141.

(30) Foreign Application Priority Data

Apr. 4, 2016 (JP) .................................. 2016-075331

(51) Int. Cl.
| | |
|---|---|
| *H01L 27/32* | (2006.01) |
| *H01L 27/12* | (2006.01) |
| *H01L 51/00* | (2006.01) |
| *G02F 1/1333* | (2006.01) |
| *G02F 1/1345* | (2006.01) |

(52) U.S. Cl.
CPC .......... *H01L 27/3276* (2013.01); *H01L 27/12* (2013.01); *H01L 27/1218* (2013.01); *H01L 27/1248* (2013.01); *H01L 51/0097* (2013.01); *G02F 1/1345* (2013.01); *G02F 1/133305* (2013.01); *H01L 27/1244* (2013.01); *H01L 27/3246* (2013.01); *H01L 27/3258* (2013.01); *H01L 2251/5338* (2013.01); *Y02E 10/549* (2013.01)

(58) Field of Classification Search
CPC ..... H01L 27/12; H01L 27/32; H01L 27/3276; H01L 51/0097
USPC ......................................................... 257/72
See application file for complete search history.

(56) References Cited

U.S. PATENT DOCUMENTS

| | | | |
|---|---|---|---|
| 7,733,456 B2 | 6/2010 | Lee | |
| 2011/0090436 A1 | 4/2011 | Choi | |
| 2012/0146886 A1 | 6/2012 | Minami et al. | |
| 2014/0217397 A1 | 8/2014 | Kwak | |
| 2014/0354143 A1 | 12/2014 | Jung | |
| 2014/0367658 A1 | 12/2014 | Kwak | |
| 2015/0221683 A1 | 8/2015 | Odaka et al. | |
| 2016/0181282 A1 | 6/2016 | Odaka et al. | |
| 2017/0117346 A1 | 4/2017 | Kim | |

(Continued)

FOREIGN PATENT DOCUMENTS

| | | |
|---|---|---|
| JP | 5720222 | 5/2015 |
| JP | 2015-148728 | 8/2015 |

*Primary Examiner* — Fazli Erdem
(74) *Attorney, Agent, or Firm* — Oblon McClelland, Maier & Neustadt, L.L.P.

(57) ABSTRACT

According to one embodiment, a display device comprises a flexible substrate, a first insulating film disposed on the flexible substrate, a switching element disposed on the first insulating film, a signal wiring electrically connected with the switching element, a first organic film disposed on the signal wiring, a connection wiring disposed on the first organic film, a second organic film disposed on the connection wiring and a pad electrode disposed on the second organic film. The connection wiring is located between the first organic film and the second organic film and is in contact with the first organic film and the second organic film.

18 Claims, 7 Drawing Sheets

(56) References Cited

U.S. PATENT DOCUMENTS

| | | |
|---|---|---|
| 2017/0176827 A1 | 6/2017 | Kawata |
| 2017/0262109 A1 | 9/2017 | Choi |
| 2017/0288007 A1 | 10/2017 | Shin |
| 2017/0309651 A1 | 10/2017 | Kim |
| 2017/0315399 A1 | 11/2017 | Kwon |

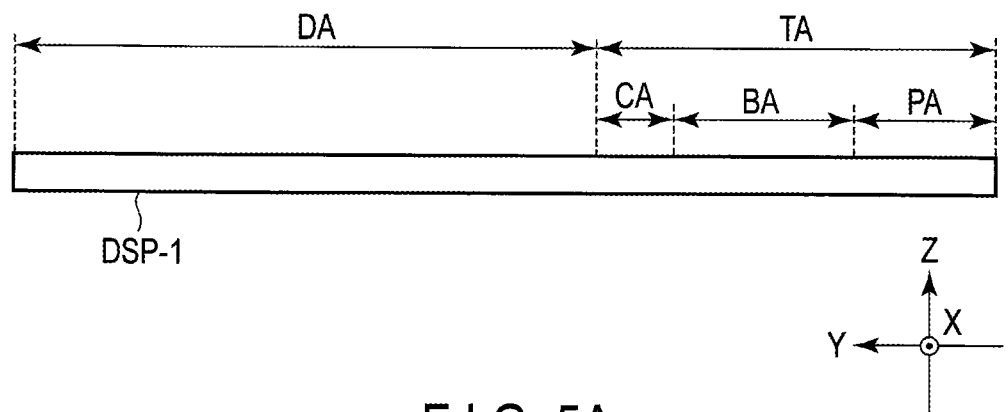
F I G. 5A
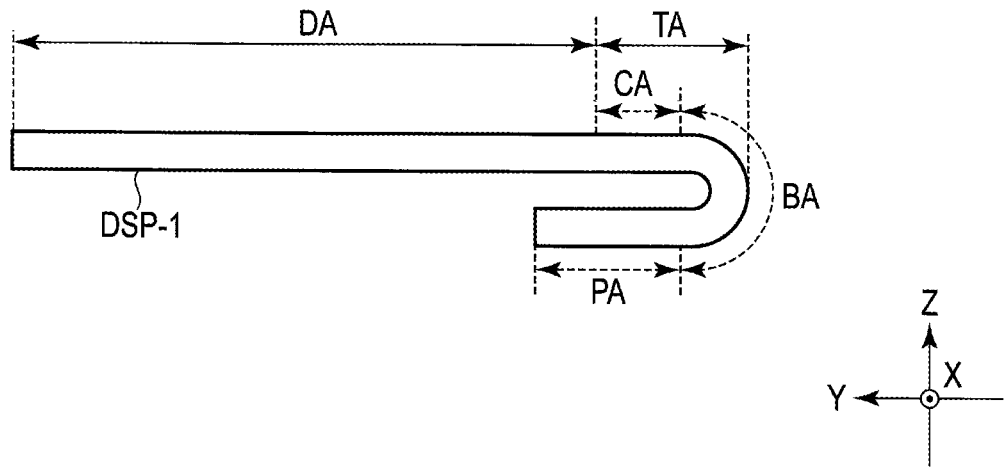
F I G. 5B

DISPLAY DEVICE

CROSS-REFERENCE TO RELATED APPLICATIONS

This application is a continuation of U.S. application Ser. No. 15/478,400 filed Apr. 4, 2017, and is based upon and claims the benefit of priority from Japanese Patent Application No. 2016-075331, filed Apr. 4, 2016, the entire contents of each of which are incorporated herein by reference.

FIELD

Embodiments described herein relate generally to a display device.

BACKGROUND

Flat-panel display devices such as those having liquid crystal panels or organic electroluminescent (EL) panels have been used in various fields. Recently, flexible display devices capable of being bent have been developed by using flexible substrates formed of flexible materials as boards for display devices.

In general, a display device includes a display area where an image is displayed, and a frame area located around the display region and connected to drive circuits and external circuits.

This display device is strongly required to make a frame area narrower (i.e., to narrow a frame) to further increase the display area from the viewpoint of performance, design, and the like. To narrow the frame of the flexible display device, the frame area of the flexible display device is bent, and the frame area outside the bent area is arranged on a back surface side of the flexible display device, thereby effectively enlarging the display area.

In the prior art display device, an inorganic electrically insulating film is sometimes disposed on the entire surface of the flexible substrate in order to prevent moisture from entering therein. The inorganic insulating film generally has a higher resistance to bending stress as compared to the flexible substrate. Therefore, in the case where the inorganic insulating film is present on the area to be bent in the display device, bending stress is applied to the inorganic insulating film when the display device is bent, which may lead to cracking of the inorganic insulating film. With the cracking of the inorganic insulating film, the wiring disposed on the inorganic insulating film may be broken.

BRIEF DESCRIPTION OF THE DRAWINGS

FIG. 5A is a schematic side view illustrating a pre-bent state of the display device of the first embodiment.

FIG. 5B is a schematic side view illustrating a bent state of the display device of the first embodiment.

DETAILED DESCRIPTION

Figure 1:
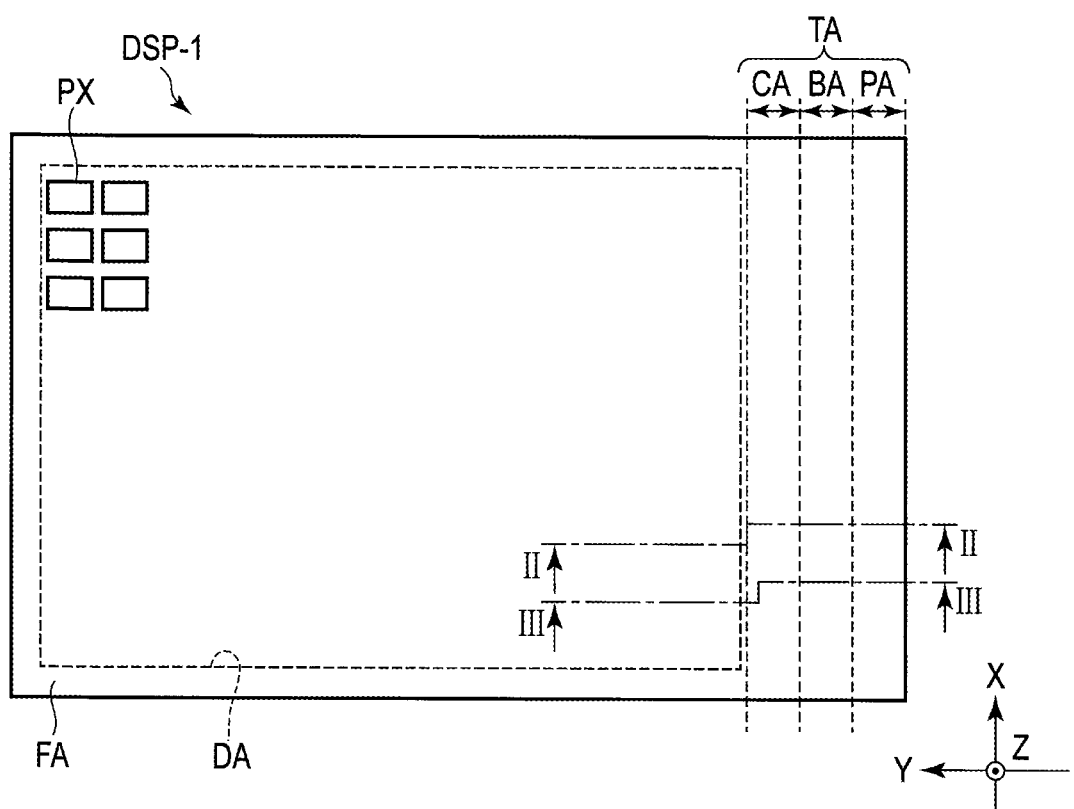
FIG. 1 is a schematic plan view of a display device according to a first embodiment.

In general, according to one embodiment, a display device comprises a flexible substrate, a first insulating film disposed on the flexible substrate, a switching element disposed on the first insulating film, a signal wiring electrically connected with the switching element, a first organic film disposed on the signal wiring, a connection wiring disposed on the first organic film, a second organic film disposed on the connection wiring and a pad electrode disposed on the second organic film. The connection wiring is located between the first organic film and the second organic film and is in contact with the first organic film and the second organic film.

Embodiments will be described hereinafter with reference to the accompanying drawings. Structures common in embodiments are denoted by the same reference numbers or symbols, duplicate explanations being omitted. Each figure is an exemplary diagram of an embodiment to aid understanding of the embodiment. The shapes, dimensions or ratios in the drawings may differ from those of the actual device, but they are merely exemplary and in no way restrict the interpretation of the invention.

An organic electroluminescent (EL) display device will be explained as an example of a display device in the following embodiments, but the invention can also be applied to the other display devices such as a liquid crystal display device. In addition, a top-emission type organic EL display device will be explained in the following embodiments, but the invention can also be applied to a bottom-emission type organic EL display device.

First Embodiment

Figure 2:
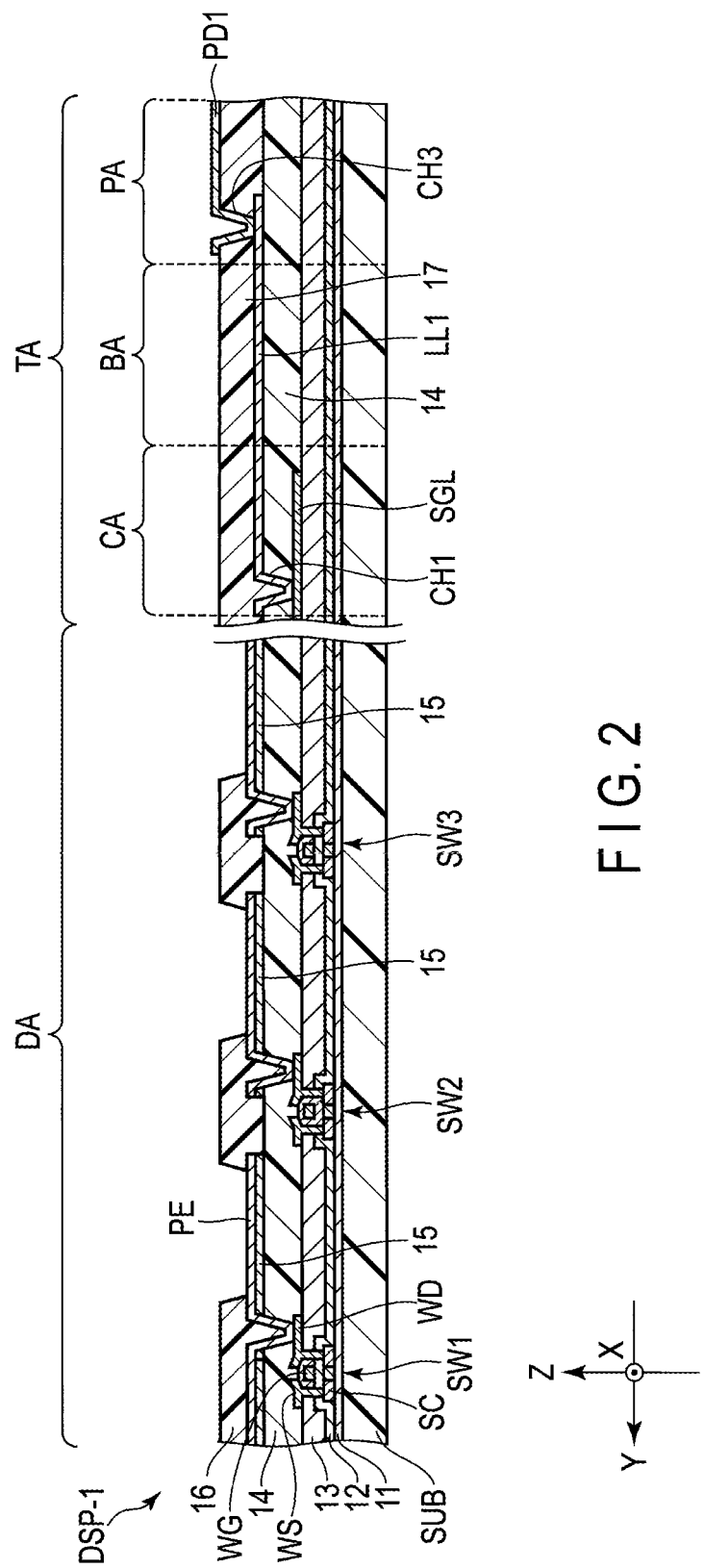
FIG. 2 is a schematic cross-sectional view taken along line II-II in FIG. 1.
Figure 3:
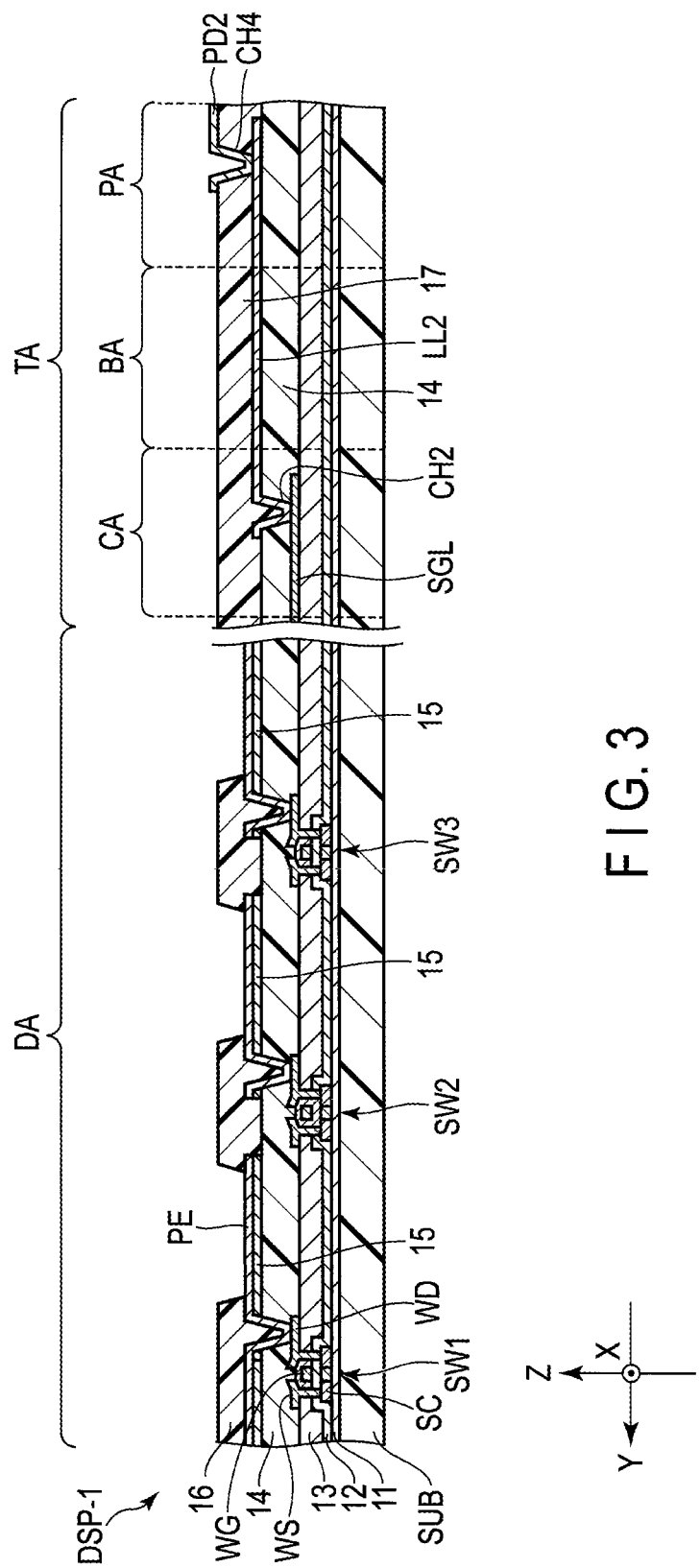
FIG. 3 is a schematic cross-sectional view taken along line in FIG. 1.
Figure 4:
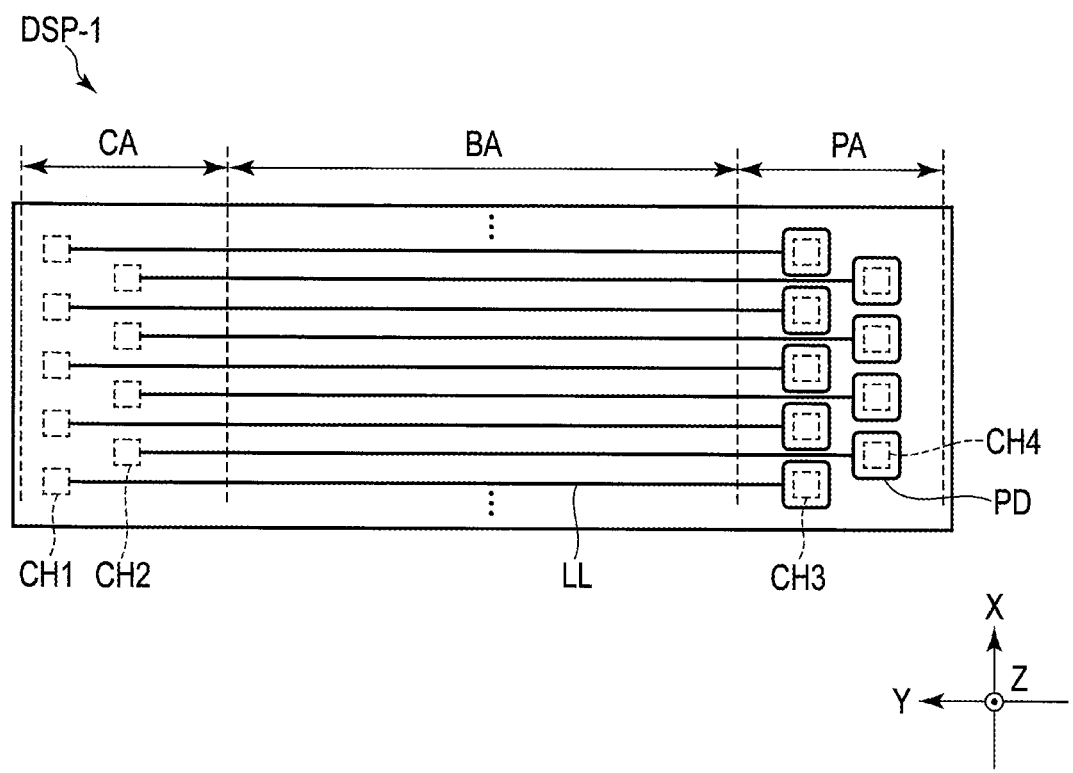
FIG. 4 is an enlarged plan view of a terminal area in the display device of the first embodiment.

A display device DSP-1 of the first embodiment will be described with reference to FIG. 1 to FIG. 5B. FIG. 1 is a schematic plan view of the display device DSP-1. FIG. 2 is a schematic cross-sectional view taken along line II-II in FIG. 1. FIG. 3 is a schematic cross-sectional view taken along line in FIG. 1. FIG. 4 is an enlarged plan view of a terminal area in the display device DSP-1. FIG. 5A is a schematic side view illustrating a pre-bent state of the display device DSP-1. FIG. 5B is a schematic side view illustrating a bent state of the display device DSP-1.

In the embodiments described herein, a direction parallel to short sides of the display device is referred to as a first direction X, a direction parallel to long sides of the display device DSP is referred to as a second direction Y, and a direction perpendicular to the first direction X and the second direction Y is referred to as a third direction Z. The first direction X and the second direction Y are orthogonal to each other but may intersect at an angle other than 90 degrees.

In addition, a positive orientation of the third direction Z is defined as an upper or upward orientation while a negative orientation of the third direction Z is defined as a lower or downward orientation, in the embodiments. According to "a second member above a first member" and "a second member below a first member", the second member may be in contact with the first member or may be distant from the first member. In the latter case, a third member may be interposed between the first member and the second member. In contrast, according to "a second member on a first member" and "a second member under a first member", the second member is in contact with the first member.

Seeing a flexible substrate SUB from the positive orientation of the third direction Z is defined as planar view in the present embodiment.

As shown in FIG. 1, the display device DSP-1 includes an image display area DA disposed on the flexible substrate SUB and a frame-shaped non-display area FA surrounding the image display area DA. The non-display area FA includes a terminal area TA located on, for example, the right side of the image display area DA so as to be adjacent to the image display area DA. The terminal area TA includes a contact area CA adjacent to the image display area DA, a bend area BA adjacent to the contact area CA, and a pad area PA adjacent to the bend area BA. In the present embodiment, the contact area CA corresponds to a first area, the bend area BA corresponds to a second area, and the pad area PA corresponds to a third area.

The image display area DA is, for example, shaped in a rectangle and is composed of a plurality of pixels PX arrayed in an m×n matrix where each of m and n is a positive integer. The display device DSP-1 comprises a plurality of signal wirings (not shown) in the image display area DA. The signal wirings include a plurality of scanning lines (not shown), a plurality of power supply lines (not shown) disposed parallel to the scanning lines, and a plurality of data signal lines (not shown) arranged orthogonally to the scanning lines.

The display device DSP-1 comprises the flexible substrate SUB as shown in FIG. 2 and FIG. 3. The flexible substrate SUB is a bendable, electrically insulating board and is formed of a flexible material containing, e.g., polyimide (PI) as a major component. The flexible substrate SUB has a thickness ranging, for example, 5 to 30 μm. Note that materials having a high heat resistance such as polyamidimide and polyaramide may be used instead of polyimide as the material of the flexible substrate SUB. It should be noted that the flexible substrate SUB is exposed to a high-temperature process during formation of a first insulating film, a second insulating film 12, a third insulating film 13, switching elements SW and the like. For this reason, the flexible substrate SUB has a high heat resistance. The flexible substrate SUB of the display device DSP-1 of the first embodiment does not need to have transparency but the flexible substrate SUB may be colored. The flexible substrate SUB can be formed by, for example, coating a temporary board such as a glass board with a material such as polyimide. The temporary board used in forming the flexible substrate SUB is peeled off from the flexible substrate SUB after drive circuits and external circuits are mounted on the display device DSP-1.

The first insulating film 11 is disposed on the flexible substrate SUB. The first insulating film 11 suppresses ionic impurities, moisture and the like entering from the flexible substrate SUB into the switching element which will be explained later. The first insulating film 11 is formed of, for example, an inorganic material such as silicon nitride (SiN), silicon oxide (SiO) or silicon oxynitride (SiON) and is constituted as a single-layer body or a stacked layer body.

Switching elements SW1, SW2 and SW3 are disposed on the first insulating film 11, in the image display area DA. The switching elements SW1, SW2 and SW3 correspond to one pixel PX, respectively. For example, the switching element SW1 corresponds to a red pixel, the switching element SW2 corresponds to a green pixel and the switching element SW3 corresponds to a blue pixel. Each of the switching elements SW1, SW2 and SW3 is, for example, a thin-film transistor (TFT) including a semiconductor layer SC. Since the switching elements SW1, SW2 and SW3 have the same structures, the structure of the switching element SW1 will be specifically explained here.

The switching element SW1 is constituted as a top-gate type switching element but may be a bottom-gate type switching element. The switching element SW1 comprises a semiconductor layer SC formed of, for example, amorphous silicon. The semiconductor layer SC includes a channel region, a source region, and a drain region. The semiconductor layer SC is covered with the second insulating film 12. The second insulating film 12 is disposed also on the first insulating film 11. The second insulating film 12 is formed of an inorganic material, e.g., tetraethylorthosilicate (TEOS).

A gate electrode WG of the switching element SW1 is disposed on the second insulating film 12 and located just above the channel region of the semiconductor layer SC. The gate electrode WG is covered with the third insulating film 13. The third insulating film 13 is disposed also on the second insulating film 12. The third insulating film 13 is formed of an inorganic material, e.g., tetraethylorthosilicate (TEOS). A source electrode WS and a drain electrode WD of the switching element SW1 are located on the third insulating film 13 and are in contact with the source region and the drain region of the semiconductor layer SC through contact holes formed in the third insulating film 13.

A signal wiring SGL is located on the third insulating film 13 and is electrically connected with the switching element SW1. The signal wiring SGL extends to the contact area CA adjacent to the image display area DA. The signal wiring SGL is formed of, for example, MoW or the like.

The source electrode WS, the drain electrode WD and the signal wiring SGL are covered with the first organic film 14. The first organic film 14 is disposed also on the third insulating film 13. The first organic film 14 is formed of an organic material having a high buffering, or shock-absorbing property such as a hard resin coat (HRC). A reflective layer 15 is disposed on the first organic film 14. The reflective layer 15 is formed of, for example, aluminum or silver.

First electrodes PE are disposed on the reflective layer 15 and are electrically connected to the drain electrodes WD of the respective switching elements SW1, SW2, and SW3 through the contact holes formed in the first organic film 14. The first electrodes PE are formed of, for example, a transparent conductive material such as indium tin oxide (ITO) or indium zinc oxide (IZO).

A rib 16 is disposed in, for example, a grating shape or a stripe shape to electrically insulate the first electrodes PE on the first organic film 14 on which the image display area DA is located, from each other.

A first connection wiring LL1 is located on the first organic film 14 and is electrically connected with the signal wiring SGL on the third insulating film 13 through a first contact hole CH1 formed in the first organic film 14, in the terminal area TA, as shown in FIG. 2. The first connection wiring LL1 is formed of, for example, MoW/Al or the like.

A second connection wiring LL2 is located on the first organic film 14 and is electrically connected with the signal wiring SGL on the third insulating film 13 through a second contact hole CH2 formed in the first organic film 14, in the terminal area TA, as shown in FIG. 3. The second connection wiring LL2 is formed of, for example, MoW/Al or the like.

The first connection wiring LL1 and the second connection wiring LL2 are covered with a second organic film 17. The second organic film 17 is disposed also on the first insulating film 14. The second organic film 17 is formed of an organic material having a high buffering, or shock-absorbing property such as a hard resin coat (HRC), photosensitive transparent acrylic resin or photosensitive transparent polyimide. The second organic film 17 is formed of the same material as the rib 16 and can be formed in the same process as the rib 16.

A first pad electrode PD1 is located on the second organic film 17 in the pad area PA as shown in FIG. 2, and is electrically connected with the first connection wiring LL1 through a third contact hole CH3 formed in the second organic film 17.

A second pad electrode PD2 is located on the second organic film 17 in the pad area PA as shown in FIG. 3, and is electrically connected with the second connection wiring LL2 through a fourth contact hole CH4 formed in the second organic film 17.

The first pad electrode PD1 and the second pad electrode PD2 are electrically connected with drive circuits and external circuits (not shown) and can receive a power supply voltage and various signals from the drive circuits and external circuits.

The first contact holes CH1 and the second contact holes CH2 are alternately arranged in the first direction X as shown in FIG. 4. In other words, the first contact holes CH1 and the second contact holes CH2 are arranged in a zigzag state in planar view. The third contact holes CH3 and the fourth contact holes CH4 are alternately arranged in the first direction X, i.e., arranged in a zigzag state, as shown in FIG. 4. If the first contact holes CH1 and the second contact holes CH2 or the third contact holes CH3 and the fourth contact holes CH4 are arranged linearly, increase in arrangement density of the connection wiring and the pad electrodes is limited due to the surface area assigned to the first contact holes CH1 and the second contact holes CH2, the third contact holes CH3 and the fourth contact holes CH4 or the like. However, the first connection wirings LL1, the second connection wirings LL2, the first to forth contact holes CH1, CH2, CH3 and CH4, and the pad electrodes PD can be disposed at higher density, since the first contact holes CH1 and the second contact holes CH2 are arranged to be displaced from each other in the first direction X and the third contact holes CH3 and the fourth contact holes CH4 are arranged to be displaced from each other in the first direction X by arranging the first contact holes CH1 and the second contact holes CH2 and/or the third contact holes CH3 and the fourth contact holes CH4 in a zigzag state.

In the display device DSP-1, in the pre-bent state as shown in FIG. 5A, the contact area CA, the bend area BA and the pad area PA are arranged to be adjacent to each other in the second direction Y, in the terminal area TA. In the bent state as shown in FIG. 5B, the bend area BA is bent such that the pad area PA is located under the image display area DA of the flexible substrate SUB.

The display device DSP-1 of the first embodiment is an active-matrix display device and, an organic light-emitting layer, a second electrode, a sealing layer, a counter substrate, and the like are disposed on the first electrode PE though not illustrated.

According to the first embodiment, the width of the terminal area TA can be made smaller and the image display area DA can be effectively enlarged by bending the bend area BA such that the pad area PA is located under the image display area DA of the flexible substrate SUB, in the terminal area TA, as shown in FIG. 5B.

In addition, if the bend area BA in the state shown in FIG. 5A is bent as shown in FIG. 5B, a bending stress is applied to the first to third insulating films 11 to 13 located in the bend area BA and crack may occur. For this reason, crack may be propagated to the first connection wirings LL1 and the second connection wirings LL2 located above the first to third insulating films 11 to 13 located in the bend area BA.

In the display device DSP-1 of the first embodiment, however, the first connection wirings LL1 and the second connection wirings LL2 are not in direct contact with the first to third insulating films 11 to 13 but are provided on the first organic film 14. Furthermore, the first connection wirings LL1 and the second connection wirings LL2 are covered with the second organic film 17. In other words, the first connection wirings LL1 and the second connection wirings LL2 are located between the first organic film 14 and the second organic film 17. As a result, even if crack occurs in the first to third insulating films 11 to 13 located in the bend area BA of the display device DSP-1, propagation of the crack can be suppressed by the first organic film 14. In addition, since the first connection wiring LL1 and the second connection wiring LL2 are located between the first organic film 14 and the second organic film 17, a break in the first connection wiring LL1 and the second connection wiring LL2 can be suppressed. Therefore, a break in the first connection wiring LL1 and the second connection wiring LL2 can be suppressed and the high-reliability display device DSP-1 can be obtained.

Second Embodiment

Figure 6:
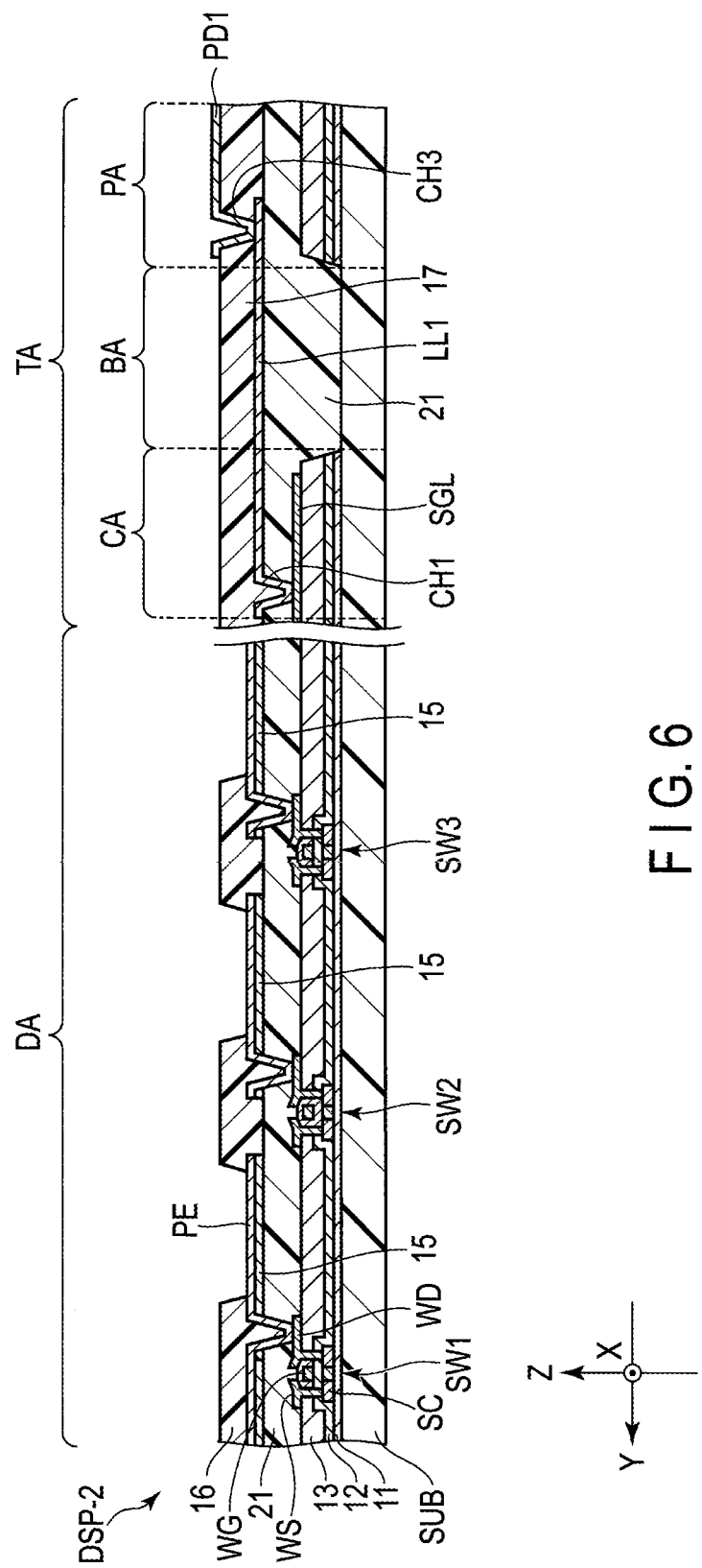
FIG. 6 is a schematic cross-sectional view of a display device according to a second embodiment, corresponding to the cross-sectional view of FIG. 2.
Figure 7:
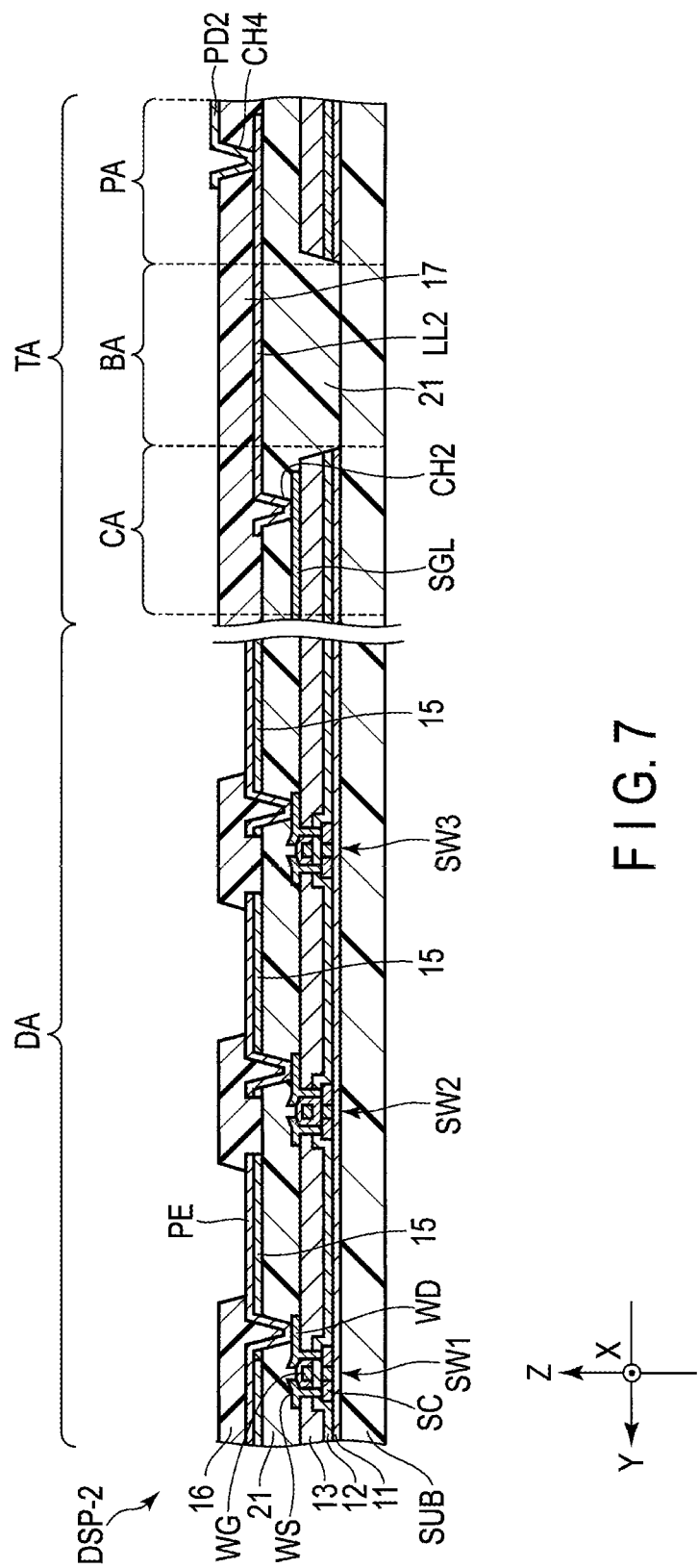
FIG. 7 is a schematic cross-sectional view of a display device according to the second embodiment, corresponding to the cross-sectional view of FIG. 3.

A display device DSP-2 of the second embodiment will be described with reference to FIG. 6 and FIG. 7. FIG. 6 is a schematic cross-sectional view of the display device DSP-2, corresponding to the cross-sectional view of the DSP-1 shown in FIG. 2. FIG. 7 is a schematic cross-sectional view of the display device DSP-2, corresponding to the cross-sectional view of the DSP-1 shown in FIG. 3. Note that the plan view of the display device DSP-2 is the same as the plan view of the display device DSP-1 shown in FIG. 1. The same members as those of the first embodiment explained with reference to FIG. 1 to FIG. 5B are denoted by the same reference numerals and their detailed descriptions are omitted.

In the display device DSP-2 of the second embodiment, the first insulating film 11, the second insulating film 12 and the third insulating film 13 are disposed in the contact area CA and the pad area PA but are not disposed in the bend area BA, in the terminal area TA. In other words, the first to third insulating films 11 to 13 do not exist on the flexible substrate SUB located in the bend area BA.

The signal wiring SGL is located on the third insulating film 13 and is electrically connected with the switching element SW1. The signal wiring SGL extends to the contact area CA adjacent to the image display area DA. The signal wiring SGL is formed of, for example, MoW or the like. The source electrode WS, the drain electrode WD and the signal wiring SGL are covered with a first organic film 21. The first organic film 21 is disposed also on the third insulating film 13. The first organic film 21 is disposed also on the flexible substrate SUB. The first organic film 21 is formed of an organic material having a high buffering, or shock-absorbing property such as a hard resin coat (HRC).

The first connection wiring LL1 is disposed on the first organic film 21 and is electrically connected with the signal wiring SGL on the third insulating film 13 through a first contact hole CH1 formed in the first organic film 21, in the terminal area TA, as shown in FIG. 6. The second connection wiring LL2 is disposed on the first organic film 21 and is electrically connected with the signal wiring SGL on the third insulating film 13 through a second contact hole CH2 formed in the first organic film 21, in the terminal area TA, as shown in FIG. 7.

The first connection wiring LL1 and the second connection wiring LL2 are covered with the second organic film 17. The second organic film 17 is disposed also on the first insulating film 21. The second organic film 17 is formed of an organic material having a high buffering, or shock-absorbing property such as a hard resin coat (HRC), photosensitive transparent acrylic resin or photosensitive transparent polyimide.

In the display device DSP-2, in the pre-bent state similar to the state explained with reference to FIG. 5A, the contact area CA, the bend area BA and the pad area PA are arranged to be adjacent to each other in the second direction Y, in the terminal area TA. In the display device DSP-2 of the second embodiment, the bend area BA is bent such that the pad area PA is located under the image display area DA of the flexible substrate SUB, similarly to the state shown in FIG. 5B.

According to the second embodiment, the width of the terminal area TA can be made smaller and the image display area DA can be effectively enlarged by bending the bend area BA such that the pad area PA is located under the image display area DA of the flexible substrate SUB, in the terminal area TA, as shown in FIG. 5B.

In addition, according to the second embodiment, the first to third insulating films 11 to 13 do not exist in the bend area BA as shown in FIG. 6 and FIG. 7. In other words, according to the second embodiment, the first organic film 21, the first connection wiring LL1, the second connection wiring LL2, and the second organic film 17 are disposed in the bend area BA. As a result, even if a bending stress is applied to the bend area BA, a break in the first connection wiring LL1 and the second connection wiring LL2 can be suppressed since the first to third insulating films 11 to 13 in which crack easily occurs do not exist. In addition, since the first connection wiring LL1 and the second connection wiring LL2 are located between the first organic film 21 and the second organic film 17, a break in the first connection wiring LL1 and the second connection wiring LL2 can be further suppressed. The high-reliability display device DSP-2 can be therefore obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and chances in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a flexible substrate;
   a first insulating film provided on the flexible substrate;
   a semiconductor layer provided on the first insulating film;
   a second insulating film provided on the semiconductor layer;
   a gate electrode provided on the second insulating film;
   a third insulating film provided on the gate electrode;
   a signal wiring provided on the third insulating film and electrically connected with the semiconductor layer;
   a first organic film provided on the signal wiring;
   a connection wiring provided on the first organic film and electrically connected with the signal wiring through a first contact hole in the first organic film;
   a second organic film provided on the connection wiring and the first organic film; and
   a pad electrode provided on the second organic film and electrically connected with the connection wiring through a second contact hole in the second organic film,
   wherein
   the connection wiring is in contact with the first organic film and the second organic film,
   the semiconductor layer and the signal wiring are located in a first region, in a plan view,
   the connection wiring and the pad electrode are located in a second region which is adjacent to the first region, in a plan view,
   the second region includes a first portion adjacent to the first region, a second portion adjacent to the first portion, and a third portion adjacent to the second portion,
   the second portion is located between the first portion and the third portion, in a plan view,
   the first contact hole is located in the first portion,
   the second contact hole is located in the third portion,
   the first insulating film, the second insulating film, and the third insulating film are not provided in the second portion,
   the first organic film is in contact with a surface of the flexible substrate in the second portion, and
   a thickness of the first organic film located in the second portion is larger than a thickness of the first organic film located in the first portion.

2. The electronic device of claim 1, wherein
   the flexible substrate is bent at the second portion in which the connection wiring is located between the first organic film and the second organic film.

3. The electronic device of claim 1, wherein
   the connection wiring is formed continuously as one unitary wiring from the first contact hole to the pad electrode.

4. The electronic device of claim 1, wherein
   the connection wiring is out of contact with the first insulating film.

5. The electronic device of claim 1, wherein
   at least one of the first contact hole and the second contact hole is arranged at a plurality of positions in a zigzag state in planar view.

6. The electronic device of claim 1, wherein
   the flexible substrate is formed of polyimide.

7. The electronic device of claim 1, wherein
   the first insulating film is formed continuously from the first region to the first portion.

8. The electronic device of claim 1, wherein
   the signal wiring is formed continuously from the first region to the first portion.

9. An electronic device comprising:
   a flexible substrate;
   a first insulating film provided on the flexible substrate;
   a switching element provided on the first insulating film;
   a second insulating film provided on a semiconductor layer of the switching element;
   a third insulating film provided on a gate electrode of the switching element;
   a wiring electrically connected with the switching element;
   a first organic film provided on the third insulating film;

a second organic film provided on the first organic film; and a pad electrode electrically connected with the wiring, wherein the flexible substrate includes a portion that is bent, in the portion, the wiring is located between the first organic film and the second organic film and is in contact with the first organic film and the second organic film, the first insulating film, the second insulating film, and the third insulating film are not provided in the portion, the first organic film is in contact with a surface of the flexible substrate in the portion, and a thickness of the first organic film located in the portion is larger than a thickness of the first organic film located in a portion other than the portion.

10. The electronic device of claim 9, wherein
the wiring is out of contact with the first insulating film.

11. The electronic device of claim 9, wherein
the flexible substrate is formed of polyimide.

12. The electronic device of claim 9, wherein
the wiring includes a signal wiring and a connection wiring, the signal wiring is provided on the third insulating film, and the connection wiring is provided on the first organic film.

13. The electronic device of claim 12, wherein
the signal wiring and the connection wiring are connected with each other through a first contact portion in the first organic film.

14. The electronic device of claim 13, wherein
the first contact portion is not provided in the portion.

15. The electronic device of claim 9, wherein
the wiring includes a signal wiring and a connection wiring, the signal wiring is provided on the third insulating film, the connection wiring is provided on the first organic film, and the pad electrode is provided on the second organic film.

16. The electronic device of claim 15, wherein
the signal wiring and the connection wiring are connected with each other through a first contact portion in the first organic film, and the connection wiring and the pad electrode are connected with each other through a second contact portion in the second organic film.

17. The electronic device of claim 16, wherein
the first contact portion and the second contact portion are not provided in the portion.

18. The electronic device of claim 16, wherein
the portion is between the first contact portion and the second contact portion.

* * * * *